(12) United States Patent
Yang et al.

(10) Patent No.: US 11,093,077 B2
(45) Date of Patent: Aug. 17, 2021

(54) ELECTRONIC DEVICE WITH BIOMETRIC SENSOR

(71) Applicant: InnoLux Corporation, Miao-Li County (TW)

(72) Inventors: Hui-Ching Yang, Miao-Li County (TW); Tao-Sheng Chang, Miao-Li County (TW); Te-Yu Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/808,280

(22) Filed: Mar. 3, 2020

(65) Prior Publication Data

US 2020/0310617 A1 Oct. 1, 2020

(30) Foreign Application Priority Data

Mar. 28, 2019 (CN) .......................... 201910244219.9

(51) Int. Cl.
*G06F 3/041* (2006.01)
*G06K 9/00* (2006.01)
*H03K 17/96* (2006.01)

(52) U.S. Cl.
CPC ....... *G06F 3/04166* (2019.05); *G06K 9/0002* (2013.01); *H03K 17/96* (2013.01); *H03K 2017/9606* (2013.01)

(58) Field of Classification Search
CPC .................................................. G06F 3/04166
See application file for complete search history.

(56) References Cited

U.S. PATENT DOCUMENTS

2015/0062465 A1\* 3/2015 Her ........................ G06F 3/0443
349/12
2019/0018540 A1\* 1/2019 Ko ......................... G06F 3/0445

\* cited by examiner

*Primary Examiner* — Gustavo Polo
(74) *Attorney, Agent, or Firm* — Winston Hsu

(57) ABSTRACT

An electronic device includes a touch sensing layer, a touch sensor, a biometric sensor and a driver. The touch sensor is used to identify a touch location and output a touch signal upon the touch sensing layer being touched. The biometric sensor includes a plurality of sensing blocks, and is used to generate electrical signals corresponding to biometric data. The driver is coupled to the touch sensor and the biometric sensor, and is used to drive a portion of the plurality of sensing blocks according to the touch signal.

16 Claims, 8 Drawing Sheets

| E | S | The first terminal of the first switch |
|---|---|---|
| 0 | 0 | VL |
| 0 | 1 | STV |
| 1 | 0 | SEL(k-1) |
| 1 | 1 | SEL(k-1) |

ELECTRONIC DEVICE WITH BIOMETRIC SENSOR

CROSS REFERENCE TO RELATED APPLICATION

This non-provisional application claims priority of China patent application No. 201910244219.9, filed on 28 Mar. 2019, included herein by reference in its entirety.

BACKGROUND OF THE DISCLOSURE

1. Field of the Disclosure

The disclosure relates to an electronic device, and specifically, to an electronic device capable of reading biometric data by blocks.

2. Description of the Prior Art

In recent years, touch screens including biometric sensors have been widely adopted in television screens, mobile phones and other electronic devices. Electronic devices are equipped with biometric sensors to provide identity verification functions.

However, a full scan is required to be performed when performing biometric identification to read data such as fingerprints. It wastes a lot of time and power. Therefore, it is required to resolve the above problems.

SUMMARY OF THE DISCLOSURE

According to one embodiment, an electronic device includes a touch sensing layer, a touch sensor, a biometric sensor and a driver. The touch sensor is used to identify a touch location and output a touch signal when the touch sensing layer is touched. The biometric sensor includes a plurality of sensing blocks, and is used to generate electrical signals corresponding to biometric data. The driver is coupled to the touch sensor and the biometric sensor, and is used to drive a portion of the plurality of sensing blocks according to the touch signal.

These and other objectives of the present disclosure will no doubt become obvious to those of ordinary skill in the art after reading the following detailed description of the embodiment that is illustrated in the various figures and drawings.

DETAILED DESCRIPTION

Figure 1:
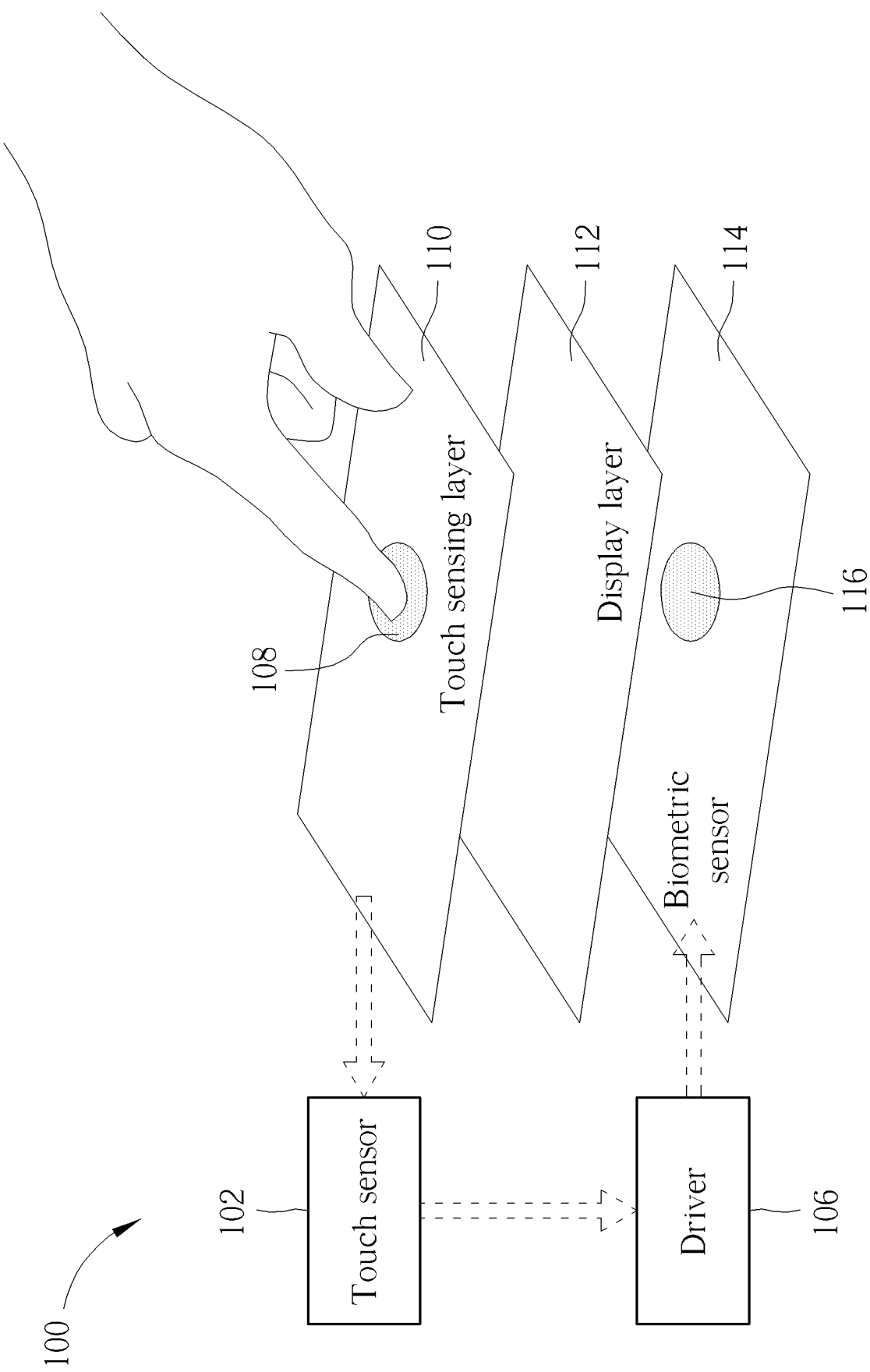
FIG. 1 is a schematic diagram of an electronic device according to an embodiment of the disclosure.

The drawings in the disclosure may be simplified schematic diagrams, and the components therein may not be drawn to scale. Further, the quantities and dimensions of various components in the drawings are merely illustrative, and are not intended to limit the scope of the present disclosure.

Certain terms in the specification and claims will be used to refer to particular components. Those skilled in the art will appreciate that manufacturers of electronic equipment may use different terms to refer to the same components in the disclosure, and the disclosure does not intend to exclude the components having the same functions but different terms. As used herein, the terms "comprising", "including" and/or "having" are used to indicate one feature, area, step, operation and/or component, and are not used to exclude more than one features, areas, steps, operations and/or components. When an element such as a layer or region is referred to as being "on" another element or extending onto another element (or variations thereof), the element may be directly on the other element, extend directly onto the other element, or an element may be present between the element and the other element. On the other hand, when an element is referred to as being "directly on" another element or extending directly onto another element (or variations thereof), there will be no element present between the element and the other element. Also, when an element is referred to as being "coupled" to another element (or variations thereof), it can be directly connected to another element or indirectly connected (e.g. electrically connected) via one or more elements to the other element.

It should be understood that the technical schemes in various embodiments of the disclosure may be replaced, combined or used together to form an embodiment without deviating from the principle of the disclosure.

FIG. 1 is a schematic diagram of an electronic device 100 according to an embodiment of the disclosure. The electronic device 100 may include a touch sensor 102, a driver 106, a touch sensing layer 110, a display layer 112 and a biometric sensor 114. When the touch sensing layer 110 is touched, the touch sensor 102 may identify a touch location 108 and output a touch signal.

The display layer 112 may display image information. The driver 106 may be coupled to the touch sensor 102 and the biometric sensor 114 to drive a plurality of sensing blocks according to the touch signal.

As shown in the embodiment in FIG. 1, the touch sensing layer 110 may be located, but is not limited to, above the display layer 112, and the biometric sensor 114 is located, but is not limited to, below the display layer 112. In some embodiments, the touch sensing layer 110 may include a substrate and at least one touch electrode. The substrate of the touch sensing layer 110 may include, but is not limited to, materials of higher hardness such as ceramics, glass, sapphire substrates or flexible materials such as polymides (PI), polycarbonates (PC), polypropylenes (PP), polyethylene terephthalates (PET), other plastics, other polymer materials, or a combination thereof. In some embodiments, the touch sensing layer 110, the display layer 112 and the biometric sensor 114 may be combined to form a single-layer or double-layer structure. For example, the touch electrode may be fabricated in an on-cell touch panel structure on an upper surface of the display layer 112, or in an in-cell touch panel structure inside the display layer 112.

In some embodiments of the disclosure, the display layer 112 may include, but is not limited to, liquid crystals (LC), light-emitting diodes (LED), organic light-emitting diode (OLED), quantum dots, quantum dot light-emitting diodes (QLED or QDLED), micro light-emitting diodes or mini light-emitting diodes. Similarly, the substrate of the display layer 112 may include, but is not limited to, materials of higher hardness such as ceramics, glass, sapphire substrates or flexible materials such as polymides (PI), polycarbonates (PC), polypropylenes (PP), polyethylene terephthalates (PET), other plastics, other polymer materials, or a combination thereof.

In the disclosure, the biometric sensor 114 may employ a sensing means to acquire data such as fingerprint. The sensing means may be, but is not limited to, capacitive, optical, ultrasonic, and/or thermal. Similarly, the biometric sensor 114 may include a substrate. The substrate of the biometric sensor 114 may include, but is not limited to, materials of higher hardness such as ceramics, glass, sapphire substrates or flexible materials such as polymides (PI), polycarbonates (PC), polypropylenes (PP), polyethylene terephthalates (PET), other plastics, other polymer materials, or a combination thereof. When a user touches the electronic device 100, the touch sensing layer 110 may output signals to the touch sensor 102, and the touch sensor 102 may identify the touch location 108 of the user and output the touch signal to the driver 106 according to the touch location 108. The driver 106 may drive sensing blocks 116 in the biometric sensor 114 corresponding to the touch location 108.

Figure 2:
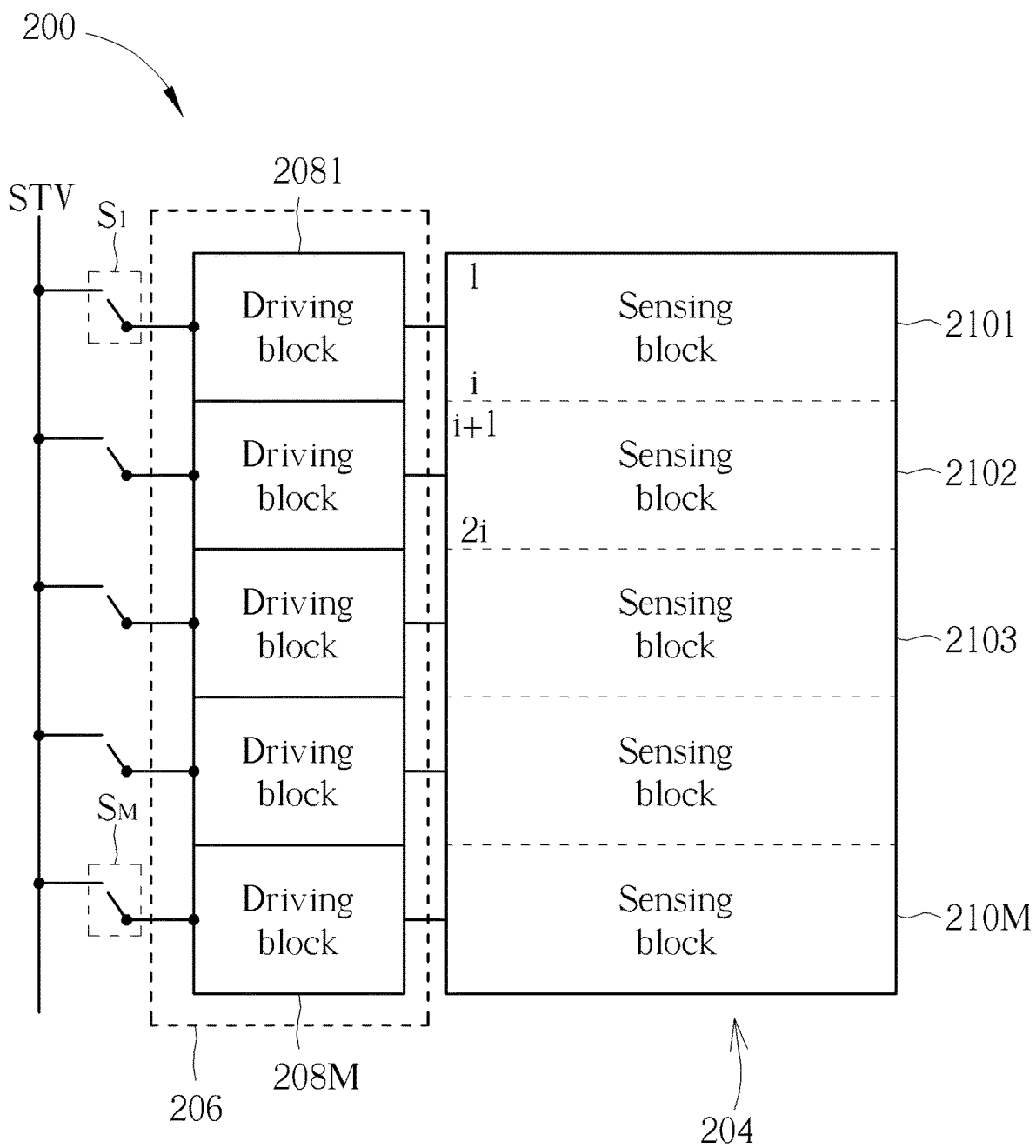
FIG. 2 is a schematic diagram of a first embodiment of the electronic device in FIG. 1.

FIG. 2 is a schematic diagram of a first embodiment of the electronic device 100. For clarity, the numbering in FIG. 2 is different from FIG. 1. The electronic device 200 in FIG. 2 includes a biometric sensor 204 and a driver 206. The biometric sensor 204 includes M sensing blocks $210_1$ to $210M$ arranged along a column direction. The driver 206 includes M driving blocks $208_1$ to $208M$, and the M driving blocks $208_1$ to $208M$ are coupled to the M sensing blocks $210_1$ to $210M$, respectively, to drive the M sensing blocks $210_1$ to $210M$. In the disclosure, an extending direction parallel to data lines (e.g., a data line 708 in FIG. 7) is referred to as the column direction, and an extending direction parallel to scan lines (e.g., a scan line 706 in FIG. 7) is referred to as the row direction. The electronic device 200 further includes a turned-on signal source STV. The driver 206 may be electrically connected to the turned-on signal source STV via second switches $S_1$ to $S_M$.

Figure 3:
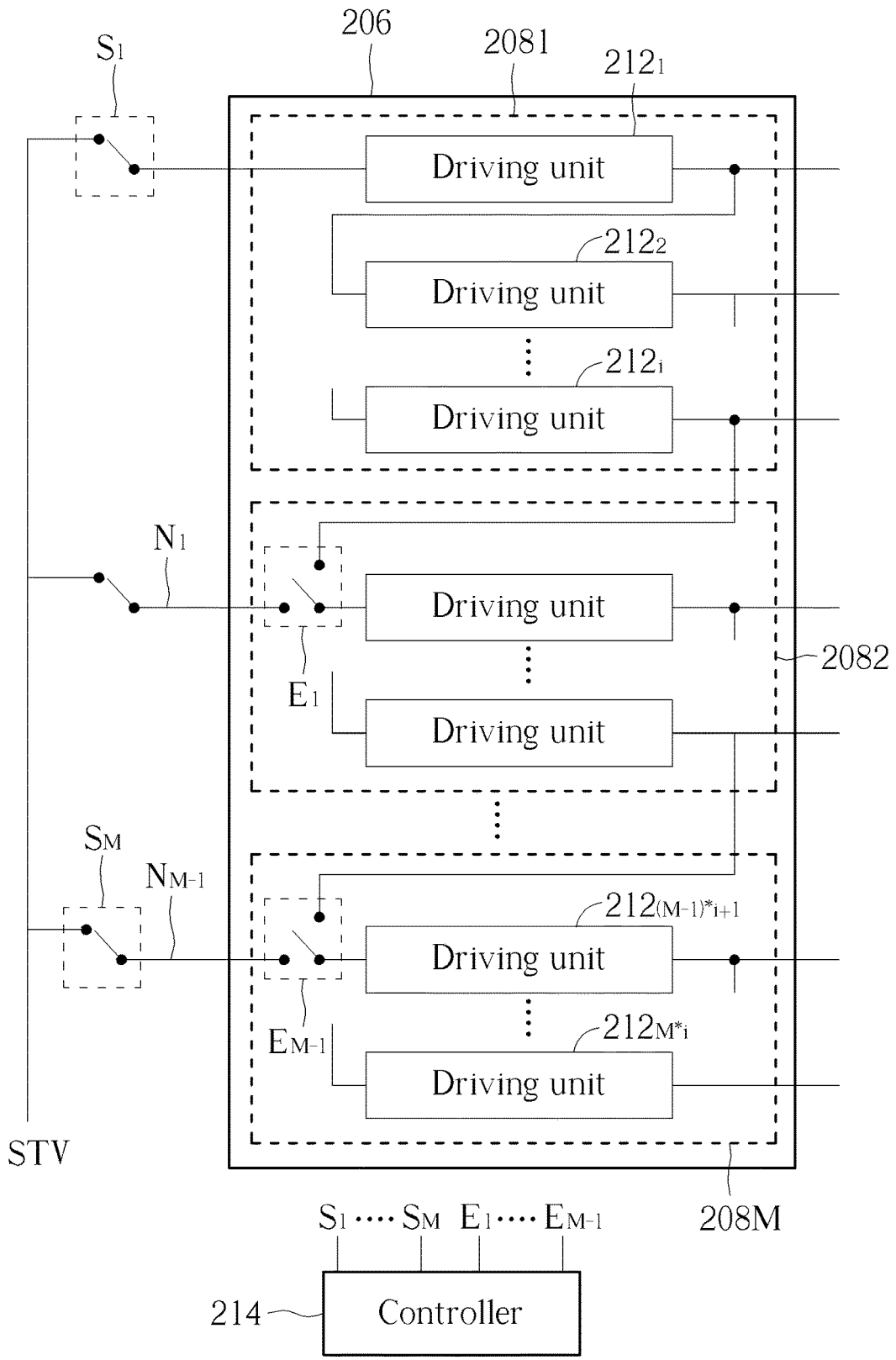
FIG. 3 is a schematic diagram of the driver in the electronic device in FIG. 1.

FIG. 3 is a schematic diagram of the driver 206 in FIG. 2. At least one of the driving blocks $208_1$ to $208M$ in FIG. 3 may include i driving units $212_1$ to $212_i$, ..., $212_{(M-1)*i+1}$ to $212_{M*i}$, and therefore, the driver 206 include (M*i) driving units $212_1$ to $212_{M-1}$. The driver 206 further includes (M−1) first switches $E_1$ to $E_{M-1}$ and M second switches $S_1$ to $S_M$. A controller 214 may be coupled to the (M−1) first switches $E_1$ to $E_{M-1}$ and the M second switches $S_1$ to $S_M$ to control switching of the (M−1) first switches $E_1$ to $E_{M-1}$ and the M second switches $S_1$ to $S_M$.

In the driving block $208_1$, a second terminal of the driving unit $212_1$ may be coupled to a first row of pixels in the sensing block $210_1$ and a first terminal of the driving unit $212_2$ (on the left side of the driving unit $212_2$), a second terminal of the driving unit $212_2$ (on the right side of the driving unit $212_2$) may be coupled to a second row of pixels in the sensing block $210_1$ and a first terminal of the driving unit $212_3$, and so on. The first terminal of the mth first switch $E_m$ may be coupled to the first terminal of the (m*i+1)th driving unit $212_{m*i+1}$, the second terminal of the mth first switch $E_m$ is selectively coupled to the second terminal of the (m*i)th driving unit $212_{m*i}$ or the mth node $N_m$. The first second switch $S_1$ may be coupled to the first terminal of the driving unit $212_1$ and the turned-on signal source STV, the (m+1) second switch $S_{m+1}$ may be coupled to the mth node $N_m$ and the turned-on signal source STV, $0<m<M$, and m and i are positive integers.

In FIG. 1, when the touch sensing layer 110 is touched, the touch sensor 102 identifies the touch location 108 and outputs the touch signal to the driver 106 to enable the driver 106 to drive a sensing block corresponding to the touch location 108. Please refer to FIGS. 2 and 3, when the touch location 108 only corresponds to a first sensing block, or the sensing block $210_1$, the touch signal may be used to drive the sensing block $210_1$, and the controller 214 may turn on the second switch $S_1$ corresponding to the sensing block $210_1$, but not other second switches $S_2$ to $S_M$, to enable the turned-on signal source STV to control the driving unit $212_1$ to control the pixels on the first row of the sensing block $210_1$ to generate electrical signals corresponding to biometric data. After the driving unit $212_1$ controls the pixels on the first row of the sensing block $210_1$ to generate the electrical signals corresponding to the biometric data, the driving unit $212_1$ may control the driving unit $212_2$ to enable the pixels on the second row of the sensing block $210_1$ to generate electrical signals corresponding to biometric data. The operation is performed row by row until the driving unit $212_i$ controls the pixels on the ith row of the sensing block $210_1$ to generate electrical signals corresponding to biometric data. In the embodiment, the electrical signals corresponding to the biometric data are transferred to a data reading terminal via a data reading circuit (such as the data line 708 in FIG. 7) to acquire the biometric data such as fingerprint.

When the touch locations 108 corresponds to a plurality of sensing blocks, such as sensing blocks $210_1$ and $210_2$, the touch signal may be used to drive the sensing block $210_1$ to generate electrical signals corresponding to the biometric data, as well as driving the sensing block $210_2$ to generate electrical signals corresponding to the biometric data. When the driving unit $212_i$ controls the ith row of the sensing block $210_1$ to generate the electrical signals corresponding to the biometric data, the controller 214 also controls the first switch E1 to connect the second terminal of the driving unit $212_i$ and the first terminal of the driving unit $212_{i+1}$ to enable the driving unit $212_i$ to complete control of the last row of pixels of the sensing block $210_1$ to generate electrical signals corresponding to biometric data, and then controls the driving unit $212_{i+1}$ to enable the first row of pixels of the sensing block $210_2$ to generate electrical signals corresponding to biometric data. After the driving unit $212_{i+1}$ controls the pixels on the first row of the sensing block $210_2$ to generate the electrical signals corresponding to the biometric data, the driving unit $212_{i+1}$ may control the driving unit $212_{i+2}$ to enable the pixels on the second row of the sensing block $210_2$ to generate electrical signals corresponding to the biometric data. The operation is performed row by row until the driving unit $212_{2i}$ controls the pixels on the ith row of the sensing block $210_2$ to generate electrical signals corresponding to the biometric data. Similarly, the electrical signals corresponding to the biometric data are transferred to data reading terminals via other data reading circuits to acquire the biometric data such as fingerprint.

When the touch location 108 corresponds to another sensing block other than the first sensing block $210_1$, such as the sensing block $210_2$, the touch signal may be used to only drive the sensing block 2102 to read the biometric data, and the controller 214 may turn on the second switch $S_2$ corresponding to the sensing block 2102, but not the other second switches $S_1$, $S_3$ to $S_M$, to couple the second terminal of the first switch $E_1$ to the node $N_1$ to enable the turned-on signal source STV to control the driving unit $212_{i+1}$ to enable the first row of pixels of the sensing block 2102 to generate electrical signals corresponding to the biometric data. After the driving unit $212_{i+1}$ completes the control of the pixels on the first row of the sensing block 2102 generating electrical signals corresponding to the biometric data, the driving unit $212_{i+1}$ may control the driving unit $212_{i+2}$ to enable the pixels on the second row of the sensing block 2102 to generate electrical signals corresponding to the biometric data. The operation is performed row by row until the driving unit $212_{2i}$ controls the pixels on the ith row of the sensing block 2102 to generate electrical signals corresponding to the biometric data. Similarly, the electrical signals corresponding to the biometric data are transferred to the data reading terminals via the other data reading circuits, to acquire the biometric data such as fingerprint.

Figure 4:
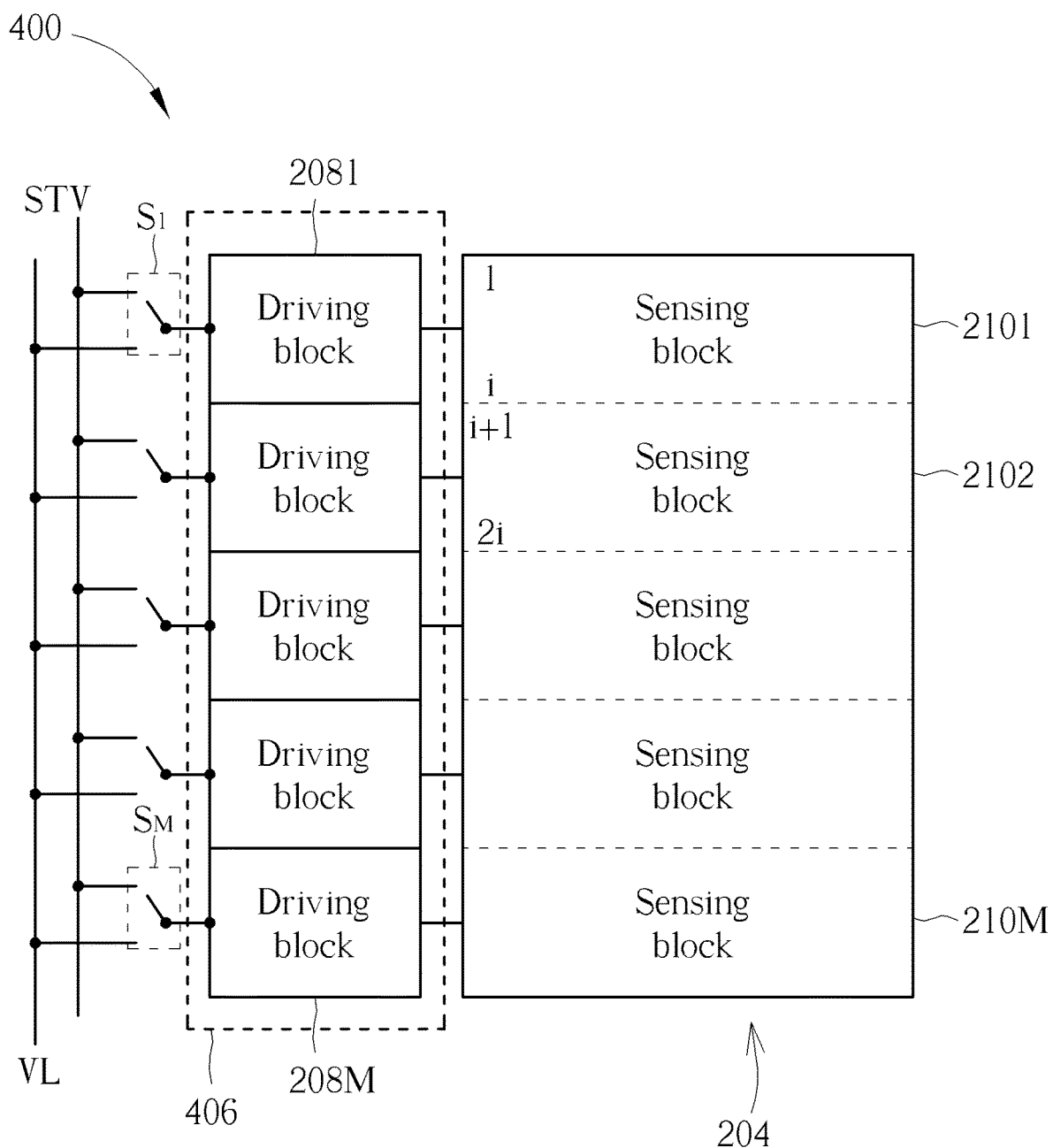
FIG. 4 is a schematic diagram of a second embodiment of the electronic device in FIG. 1.

FIG. 4 is a schematic diagram of another embodiment of the electronic device 100. For clarity, the numbering in FIG. 4 is different from FIG. 1. Similar to FIG. 2, the electronic device 400 in FIG. 4 includes the biometric sensor 204 and a driver 406. The biometric sensor 204 includes the M sensing blocks 2101 to 210M arranged along the column direction. The driver 406 includes M driving blocks 2081 to 208M, and the M driving blocks 2081 to 208M are coupled to the M sensing blocks 2101 to 210M, respectively, to drive the M sensing blocks 2101 to 210M. The electronic device 400 in FIG. 4 is different from FIG. 2 in that the electronic device 400 further includes a turned-off voltage source VL. In the disclosure, the turned-off voltage source VL may be used to reduce a leakage current.

Figure 5:
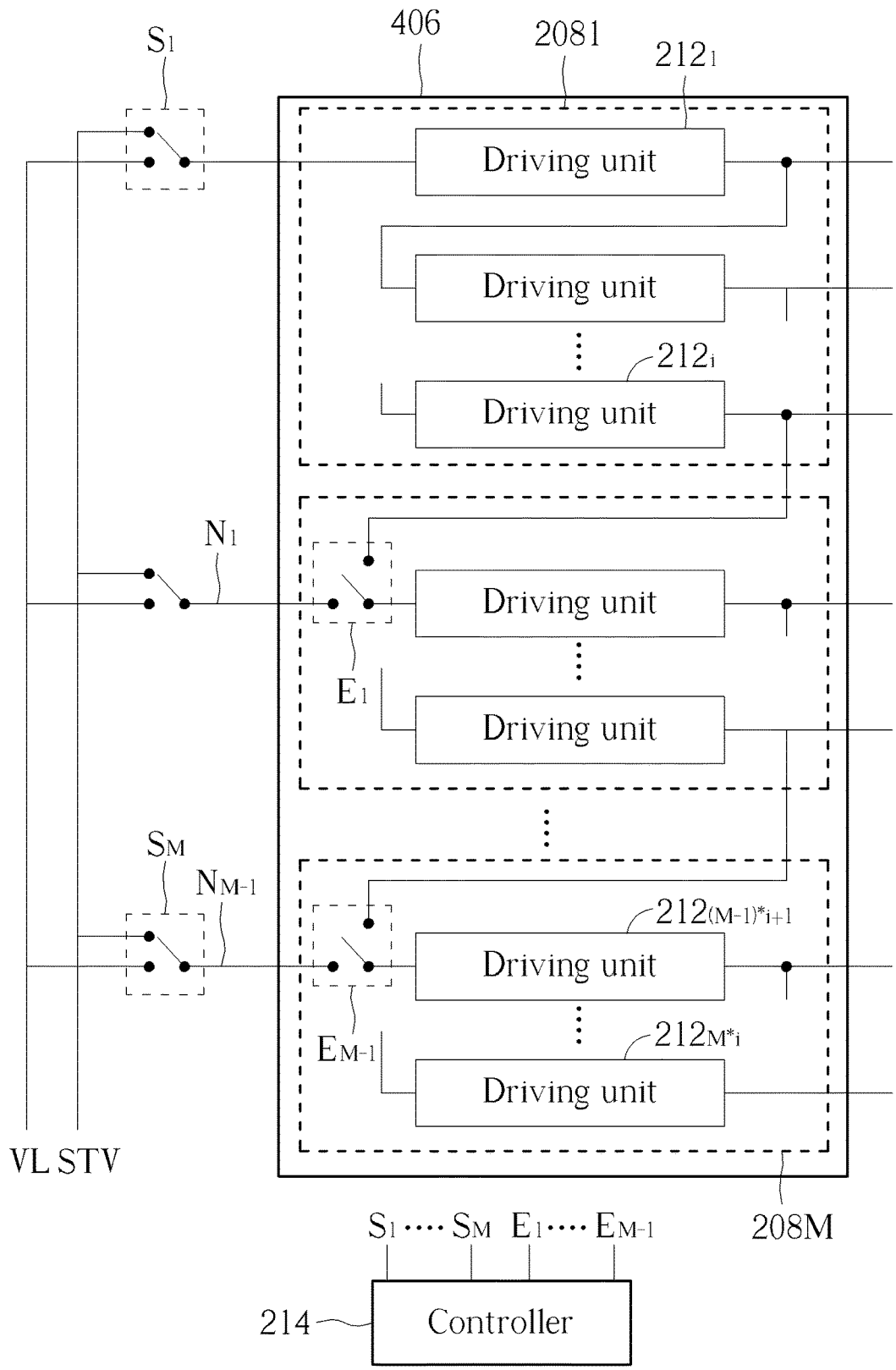
FIG. 5 is a schematic diagram of the driver in the electronic device in FIG. 4.

FIG. 5 is a schematic diagram of the driver 406 in FIG. 4. In the embodiments in FIGS. 4 and 5, the connections of the driving units $212_1$ to $212_{M*i}$ in the driving blocks 2081 to 208M are similar to the embodiment in FIG. 2, the explanation therefor will be omitted here. The embodiments in FIGS. 4 and 5 are different from FIG. 2 in that, in the driver 406, the first terminal of the first second switch $S_1$ may be coupled to the first terminal of the first driving unit $212_1$, and the second terminal of the first second switch $S_1$ may be selectively coupled to either the turned-on signal source STV or the turned-off voltage source VL. Similarly, the first terminal of the (m+1)th second switch $S_{m+1}$ may be coupled to the mth node, and the second terminal of the (m+1)th second switch $S_{m+1}$ may be selectively coupled to either the turned-on signal source STV or the turned-off voltage source VL. In the embodiment, 0<m<M, and m and i are positive integers. In some embodiments, the turned-off voltage source VL may provide a low voltage. In some embodiments, the turned-off voltage source VL may be, but is not limited to, a fixed value.

When the touch sensing layer 110 is touched, the touch sensor 102 identifies the touch location 108 and outputs the touch signal to drive a sensing block corresponding to the touch location 108. In the embodiment, the method of the touch signal driving the sensing blocks to generate and read the electrical signals corresponding to the biometric data is similar to the embodiment in FIG. 2, the explanation therefor will be omitted. The difference between this embodiment and the embodiment in FIG. 2 is that, when the touch signal only drives a portion of the sensing blocks, the controller 214 may couple the second terminal of the second switch S corresponding to the sensing block driven to the turned-on signal source STV, and couple the second terminals of the second switches corresponding to the remaining sensing block undriven to the turned-off voltage source VL.

Figure 6:
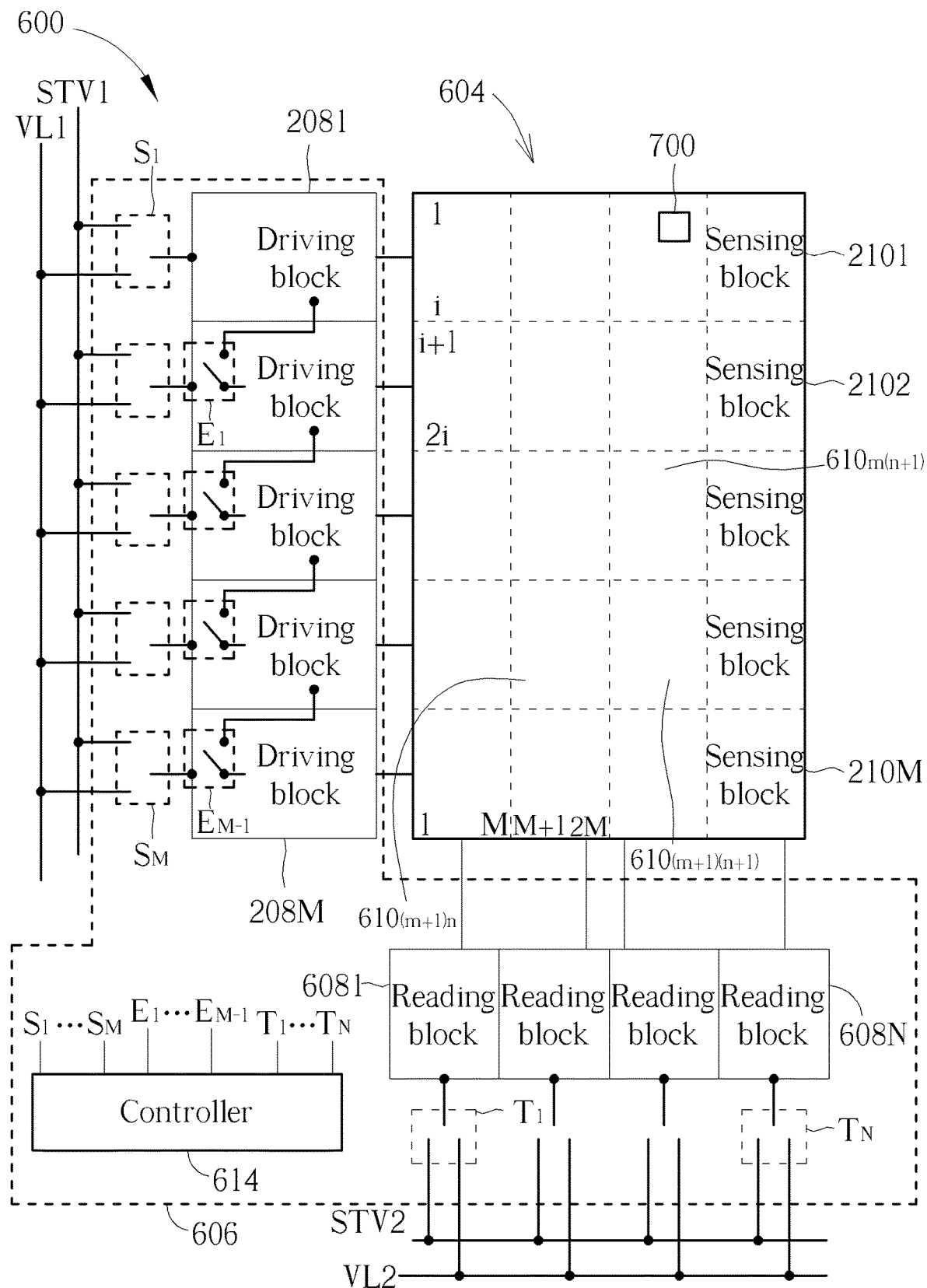
FIG. 6 is a schematic diagram of a third embodiment of the electronic device in FIG. 1.

FIG. 6 is a schematic diagram of another embodiment of the electronic device 100. For clarity, the numbering in FIG. 6 is different from FIG. 1. The electronic device 600 in FIG. 6 includes a biometric sensor 604 and a driver 606. At least one of the sensing blocks 2101 to 210M of the biometric sensor 604 may be divided into N sub-sensing blocks, and therefore, the biometric sensor 604 may include M×N sub-sensing blocks 61011 to 610NM. As shown in FIG. 6, the sub-sensing blocks 61011 to 610NM are arranged in a matrix. In the embodiment, other than the M driving blocks 2081 to 208M, the (M−1) first switches $E_1$ to $E_{M-1}$, and the M second switches $S_1$ to $S_M$, the driver 606 further includes N reading blocks 6081 to 608N, N third switches $T_1$ to $T_N$ and a controller 614. The controller 614 is coupled to the (M−1) first switches $E_1$ to $E_{M-1}$, the M second switches $S_1$ to $S_M$ and the N third switches $T_1$ to $T_N$, to control switching of the (M−1) first switches $E_1$ to $E_{M-1}$, the M second switches $S_1$ to $S_M$ and the N third switches $T_1$ to $T_N$.

In the embodiment, the electronic device 600 may further include turned-on signal sources STV1 and STV2, and turned-off voltage sources VL1 and VL2. The first switches $E_1$ to $E_{M-1}$ and the second switches $S_1$ to $S_M$ may be coupled to the turned-on signal source STV1 and the turned-off voltage source VL1 in a manner similar to FIG. 5, the explanation therefor is not repeated here. Further, the third switches $T_1$ to $T_N$ may be coupled to the turned-on signal source STV2 and the turned-off voltage source VL2 in a manner similar to those of the second switches $S_1$ to $S_M$, the explanation therefor is not repeated here.

In the embodiment in FIG. 6, the connections of the driving units $212_1$ to $212_{M*i}$ in the driving blocks 2081 to 208M are similar to the embodiment in FIG. 1, the explanation therefor will be omitted here. Similarly, at least one of the reading blocks 6081 to 608N includes a plurality of reading units, and the connections of the reading units are similar to those of the driving units $212_1$ to $212_{M*i}$ in the driving blocks 2081 to 208M, the explanation therefor will be omitted here. Likewise, by employing a driving method similar to that of the driving blocks 2081 to 208M, a portion of reading blocks 6081 to 608N may be selectively driven by controlling the third switches $T_1$ to $T_N$, to read the biometric data from the reading blocks. The operation method of the embodiment is detailed as follows.

When the touch sensing layer 110 is touched, the touch sensor 102 may identify the touch location 108 in a more precise fashion to determine a sub-sensing block (e.g., the sub-sensing block 610mn, 0<m≤M, 0<n≤N) corresponding to the touch location 108, and output the touch signal to drive the sensing block (e.g., the sensing block 210m) of the sensing blocks 2101 to 210M corresponding to the sub-sensing block 610mn. When corresponding to the sensing block 210m, the controller 614 may couple the second terminal of the second switch $S_m$ corresponding to the sensing block 210m to the turned-on signal source STV1, and the second terminal of the other $S_1$ to $S_{m-1}$, $S_{m+1}$ to $S_M$ to the turned-off voltage source VL1. The turned-on signal source STV1 may drive the driving block 208m corresponding to the sensing block 210m to enable the driving units $212_{(m-1)*i+1}$ to $212_{m*i}$ in the driving block 208m to sequentially control respective rows of pixels of the sensing block 210m to generate the electrical signals corresponding to the biometric data.

On the other hand, the touch sensor 102 also outputs the touch signal to drive the reading block 608n corresponding to the sub-sensing block 610mn. When the reading block 608n is driven, the controller 614 may couple the third switch $T_n$ corresponding to the reading block 608n to the turned-on signal source STV2, and other third switches $T_1$ to $T_{n-1}$, $T_{n+1}$ to $T_N$ to the turned-off voltage source VL2. Thus, the turned-on signal source STV2 may drive the reading block 608n to enable the respective reading units in the reading block 608n to sequentially read the electrical signals corresponding to the biometric data in the respective pixels of the sub-sensing block 610mn. In other words, in the embodiment, only the electrical signals corresponding to the biometric data in the sub-sensing block 610mn among the respective sub-sensing block 610m1 to 610mN in the sensing block 210m are read.

The disclosure is not limited to the case of the touch location 108 corresponding to only one sub-sensing block 610mn as described in the preceding paragraphs. In some embodiments, the touch location 108 may simultaneously correspond to a plurality of sub-sensing blocks, the controller 614 may selectively couple the second terminals of the second switches corresponding to the plurality of sub-sensing blocks to the turned-on signal source STV1, and couple the third switches corresponding to the plurality of sub-sensing blocks to the turned-on signal source STV2, to read the electrical signals corresponding to the biometric data.

Figure 7:
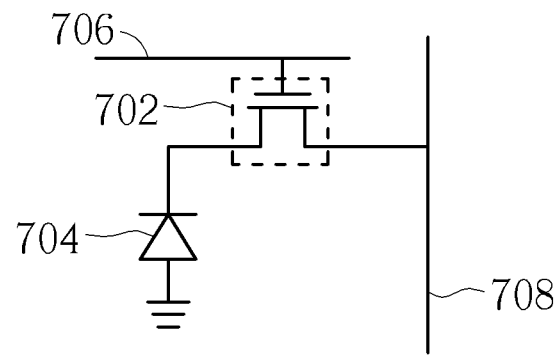
FIG. 7 is a schematic diagram of a pixel in the biometric sensor in FIG. 6.

FIG. 7 is a schematic diagram of a pixel 700 in the biometric sensor 604. The pixel 700 includes a transistor 702 and a photodiode 704. The transistor 702 has a control terminal coupled to the scan line 706, a first terminal, and a second terminal coupled to the data line 708. The photodiode 704 has a first terminal coupled to the first terminal of the transistor 702, and a second terminal coupled to a ground terminal. The first terminal of the photodiode 704 may be a cathode. The second terminal of the photodiode 704 may be an anode. When the driving unit turns on the transistor 702 via the scan line 706 and a voltage difference is applied to the photodiode 704, an electrical signal (e.g., an electrical signal corresponding to the biometric data) may be generated according to a biometric feature (e.g., a fingerprint), and transmitted to the data line 708 via the transistor 702. In the embodiments in FIGS. 2, 4, the electrical signals generated by the photodiode 704 may be transmitted to a data reading terminal via the data line 708. In the embodiments in FIG. 6, the reading blocks 6081 to 608N may be selectively controlled by the controller 614 to acquire the biometric data. The types, quantities and coupling of respective components in the pixel 700 are not limited to the embodiment in FIG. 7, and the types and the quantities of the components in the pixel may be increased and the coupling between the respective components may be changed based on the requirements.

Figure 8:
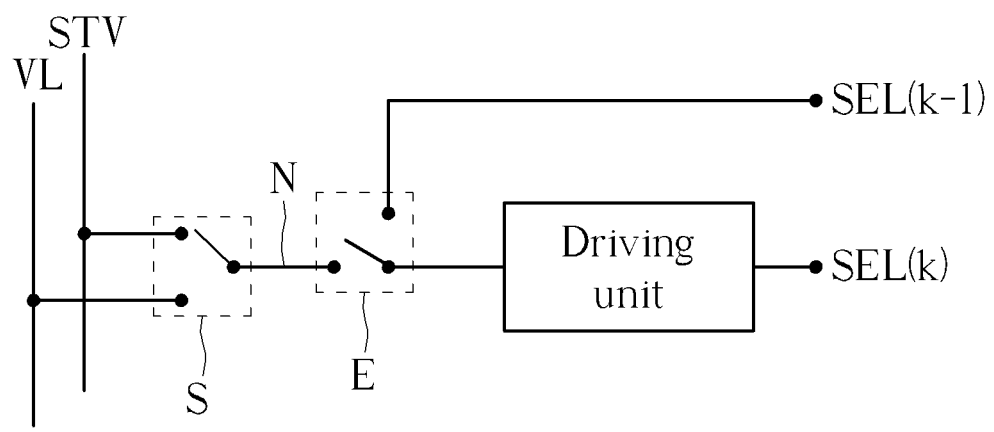
FIGS. 8, 9 are schematic diagrams of selected circuits of the driver of the electronic device in FIG. 2.
Figures 9, 10:
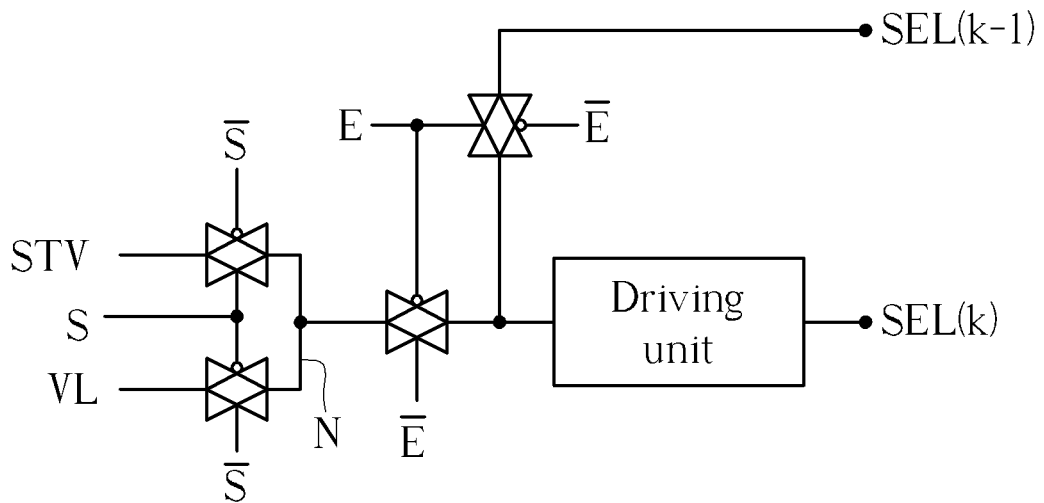
FIG. 10 is a schematic diagram of selected circuits of the driver of the electronic device in FIGS. 8, 9.

FIGS. 8 and 9 are schematic diagrams of selected circuits of the driver 214. FIG. 10 is a truth table of selected circuits of the driver 214. Please refer to FIGS. 8 to 10, when the second terminal of the first switch E is coupled to the second terminal SEL(k−1) of a preceding driving unit, the truth value of E is 1; and when the second terminal of the first switch E is coupled to the node N, the truth value of E is 0. Likewise, when the second terminal of the second switch S is coupled to the turned-off voltage VL, the truth value of S is 0. When the second terminal of the second switch S is coupled to the turned-on signal source STV, the truth value of S is 1.

Based on the truth table, when the truth value of the first switch E is 0 and the truth value of the second switch S is 0, the first terminal of the first switch E will be coupled to the turned-off voltage VL, and a driving unit in a driving block corresponding to the first switch E will be turned off. When the truth value of the first switch E is 0 and the truth value of the second switch S is 1, the first terminal of the first switch E will be coupled to the turned-on signal source STV, and the driving unit in the driving block corresponding to the first switch E will be turned on. When the truth value of the first switch E is 1, since the second terminal of the first switch E is coupled to the second terminal SEL(k−1) of a preceding driving unit, the driving unit in the driving block corresponding to the first switch E will continue to perform an operation of the preceding driving unit regardless of the truth value of the second switch S being 0 or 1.

According to the disclosure, when a touch panel reads a fingerprint, it may drive a corresponding sub-sensing block according to the touch location of a user to read data such as the fingerprint. Thus, the biometric sensor is not required to perform a full scan when reading fingerprint data, thereby achieving quick reading and low power consumption. Furthermore, according to the disclosure, the area for detecting a biometric data may be increased to achieve full-screen fingerprint recognition, enhancing usability of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
a touch sensing layer;
a touch sensor coupled to the touch sensing layer and configured to identify a touch location and output a touch signal when the touch sensing layer being touched;
a biometric sensor disposed adjacent to the touch sensing layer and comprising a plurality of sensing blocks and configured to generate electrical signals corresponding to a biometric data; and
a driver coupled to the touch sensor and the biometric sensor;
wherein the plurality of sensing blocks respectively comprise a plurality of sub-sensing blocks, the driver comprises a plurality of reading blocks configured to read the electrical signals corresponding to the biometric data of the plurality of sub-sensing blocks, and the driver drives a portion of the plurality of sensing blocks according to the touch signal.

2. The electronic device of claim 1, wherein the plurality of sensing blocks are arranged along a column direction, and the plurality of sensing blocks respectively comprise at least one row of pixels.

3. The electronic device of claim 1, wherein the sub-sensing blocks respectively comprise a plurality of pixels.

4. The electronic device of claim 1, wherein the driver comprises a plurality of third switches coupled to the plurality of reading blocks.

5. The electronic device of claim 4, further comprising a turned-on signal source and a turned-off voltage source, wherein the reading blocks are selectively coupled to the turned-on signal source or the turned-off voltage source via the plurality of third switches.

6. The electronic device of claim 4, wherein the driver further comprises a controller coupled to the plurality of third switches, and the controller is configured to control the plurality of third switches.

7. The electronic device of claim 1, wherein the driver comprises a plurality of driving blocks to drive the electrical signals corresponding to the biometric data of the portion of the plurality of sensing blocks.

8. The electronic device of claim 7, wherein the driver further comprises a plurality of first switches, and two adjacent driving blocks of the plurality of driving blocks are coupled to each other via one of the plurality of first switches.

9. The electronic device of claim 8, wherein the driver further comprises a plurality of second switches coupled to the plurality of driving blocks.

10. The electronic device of claim 9, further comprising a turned-on signal source and a turned-off voltage source, wherein the plurality of driving blocks are selectively coupled to either the turned-on signal source or the turned-off voltage source via the plurality of first switches and the plurality of second switches.

11. The electronic device of claim 9, further comprising a turned-on signal source, wherein the plurality of driving blocks are selectively coupled to the turned-on signal source by the plurality of first switches and the plurality of second switches.

12. The electronic device of claim 9, further comprising a controller coupled to the plurality of first switches and the plurality of second switches, and the controller configured to control the plurality of first switches and the plurality of second switches.

13. The electronic device of claim 9, wherein the turned-off voltage source is configured to provide a fixed low voltage.

14. The electronic device of claim 1, wherein at least one of the plurality of driving blocks comprises a plurality of sequentially coupled driving units.

15. The electronic device of claim 1, wherein at least one of the plurality of sensing blocks comprises a plurality of pixels, and at least one of the plurality of pixels comprises:
a transistor having a control terminal coupled to a scan line, a first terminal, and a second terminal coupled to a data line, and
a photodiode having a first terminal coupled to the first terminal of the transistor, and a second terminal coupled to a ground terminal.

16. The electronic device of claim 15, wherein the first terminal of the photodiode is a cathode, and the second terminal of the photodiode is an anode.

* * * * *